(12) United States Patent
Ohmi et al.

(10) Patent No.: US 7,893,537 B2
(45) Date of Patent: Feb. 22, 2011

(54) SEMICONDUCTOR DEVICE

(75) Inventors: Tadahiro Ohmi, Miyagi (JP); Akinobu Teramoto, Miyagi (JP)

(73) Assignee: Tohoku Uinversity, Miyagi (JP)

( * ) Notice: Subject to any disclaimer, the term of this patent is extended or adjusted under 35 U.S.C. 154(b) by 532 days.

(21) Appl. No.: 11/795,308

(22) PCT Filed: Jan. 17, 2006

(86) PCT No.: PCT/JP2006/000474

§ 371 (c)(1),
(2), (4) Date: Jul. 16, 2007

(87) PCT Pub. No.: WO2006/077802

PCT Pub. Date: Jul. 27, 2006

(65) Prior Publication Data

US 2008/0093679 A1  Apr. 24, 2008

(30) Foreign Application Priority Data

Jan. 18, 2005 (JP) ............................. 2005-010117

(51) Int. Cl.
  *H01L 23/48* (2006.01)
(52) U.S. Cl. ................ 257/759; 257/E23.154
(58) Field of Classification Search ........... 257/374, 257/395–396; 438/780–781, 595
  See application file for complete search history.

(56) References Cited

U.S. PATENT DOCUMENTS

| 5,650,650 | A | * | 7/1997 | Ohmi et al. | ............... | 257/351 |
|---|---|---|---|---|---|---|
| 5,698,901 | A | | 12/1997 | Endo | | |
| 5,989,988 | A | * | 11/1999 | Iinuma et al. | ............... | 438/592 |
| 6,033,979 | A | * | 3/2000 | Endo | .......................... | 438/622 |
| 6,218,299 | B1 | | 4/2001 | Akahori et al. | | |
| 6,469,390 | B2 | | 10/2002 | Chang et al. | | |
| 6,730,618 | B2 | * | 5/2004 | Cohen et al. | ................ | 438/780 |
| 7,230,296 | B2 | * | 6/2007 | Gluschenkov et al. | ...... | 257/327 |
| 2001/0014512 | A1 | * | 8/2001 | Lyons et al. | ................ | 438/424 |
| 2002/0000669 | A1 | | 1/2002 | Chang et al. | | |
| 2002/0020917 | A1 | * | 2/2002 | Hirota et al. | ................ | 257/758 |
| 2004/0129975 | A1 | * | 7/2004 | Koh et al. | .................... | 257/347 |
| 2004/0152278 | A1 | * | 8/2004 | Farrar | ........................ | 438/400 |

FOREIGN PATENT DOCUMENTS

| JP | 8-222557 | 8/1996 |
|---|---|---|
| JP | 10-144677 | 5/1998 |
| JP | 2000-223572 A | 8/2000 |

OTHER PUBLICATIONS

A. Grill, "Amorphous carbon based materials as the interconnect dielectric in ULSI chips," Diamond and Related Materials 19(2001), pp. 234-239, Elsevier Science B.V.

* cited by examiner

*Primary Examiner*—Matthew W Such
*Assistant Examiner*—Ali Naraghi
(74) *Attorney, Agent, or Firm*—Foley & Lardner LLP

(57) ABSTRACT

At least part of an element isolation region, an interlayer insulating film, and a protection insulating film, other than a gate insulating film (silicon oxide film), is formed of carbon fluoride ($CF_x$, $0.3 < x < 0.6$) or hydrocarbon ($CH_y$, $0.8 < y < 1.2$).

5 Claims, 3 Drawing Sheets

[Fig. 1]
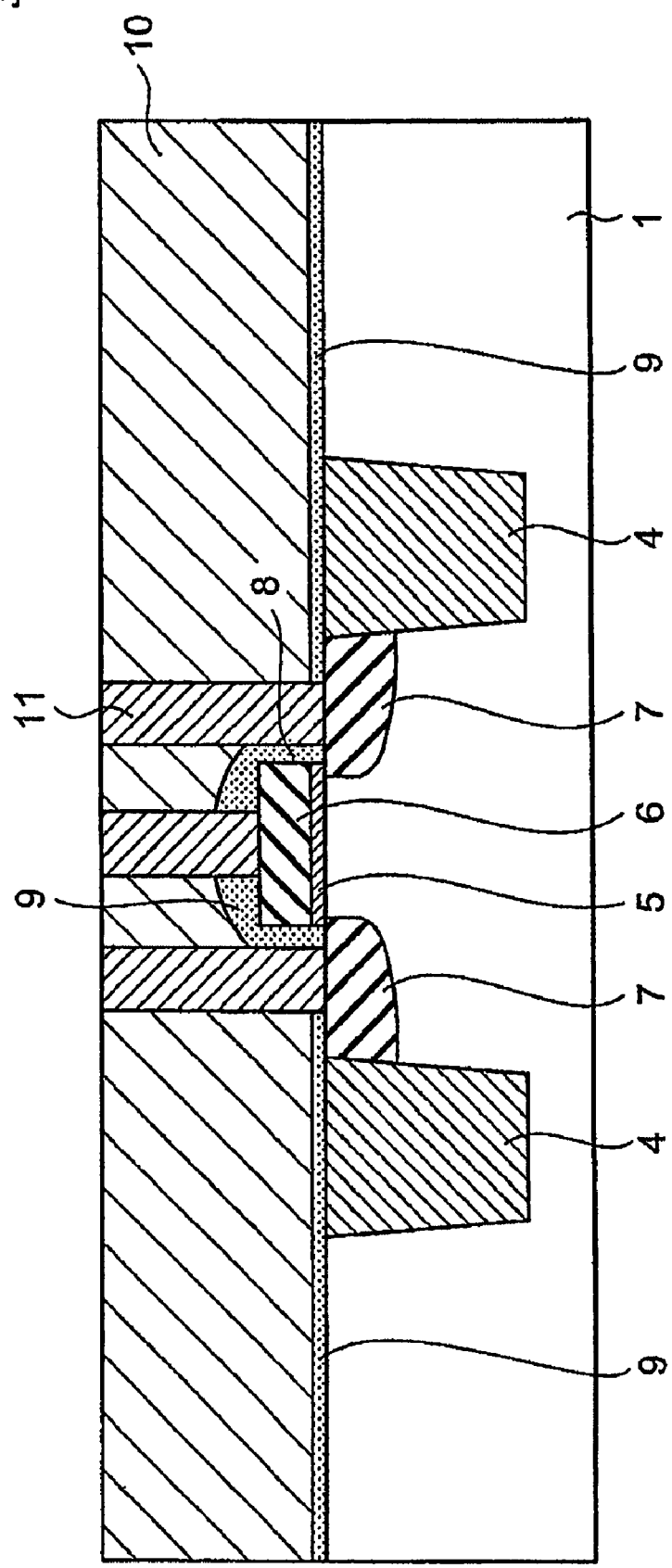

[Fig. 2]
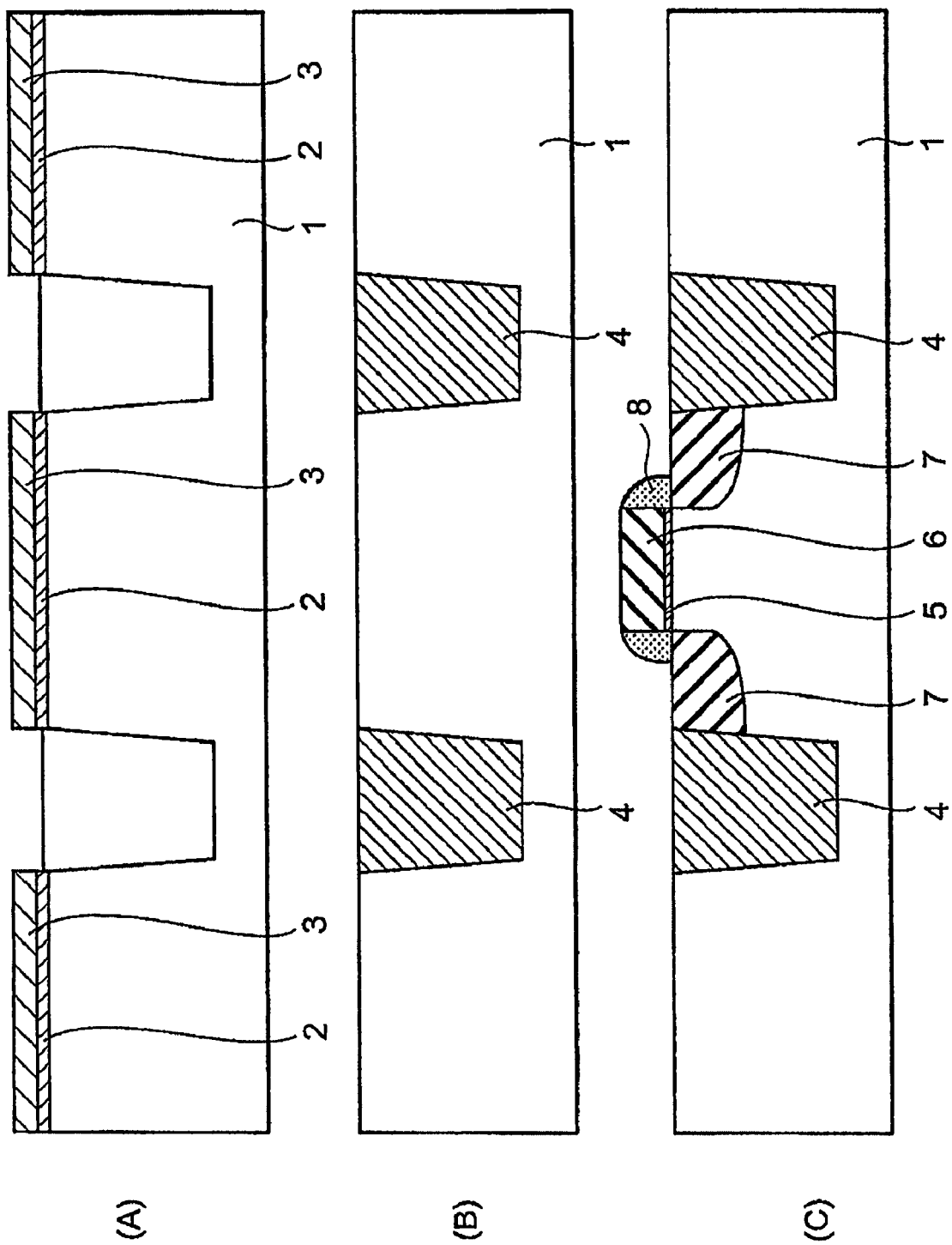

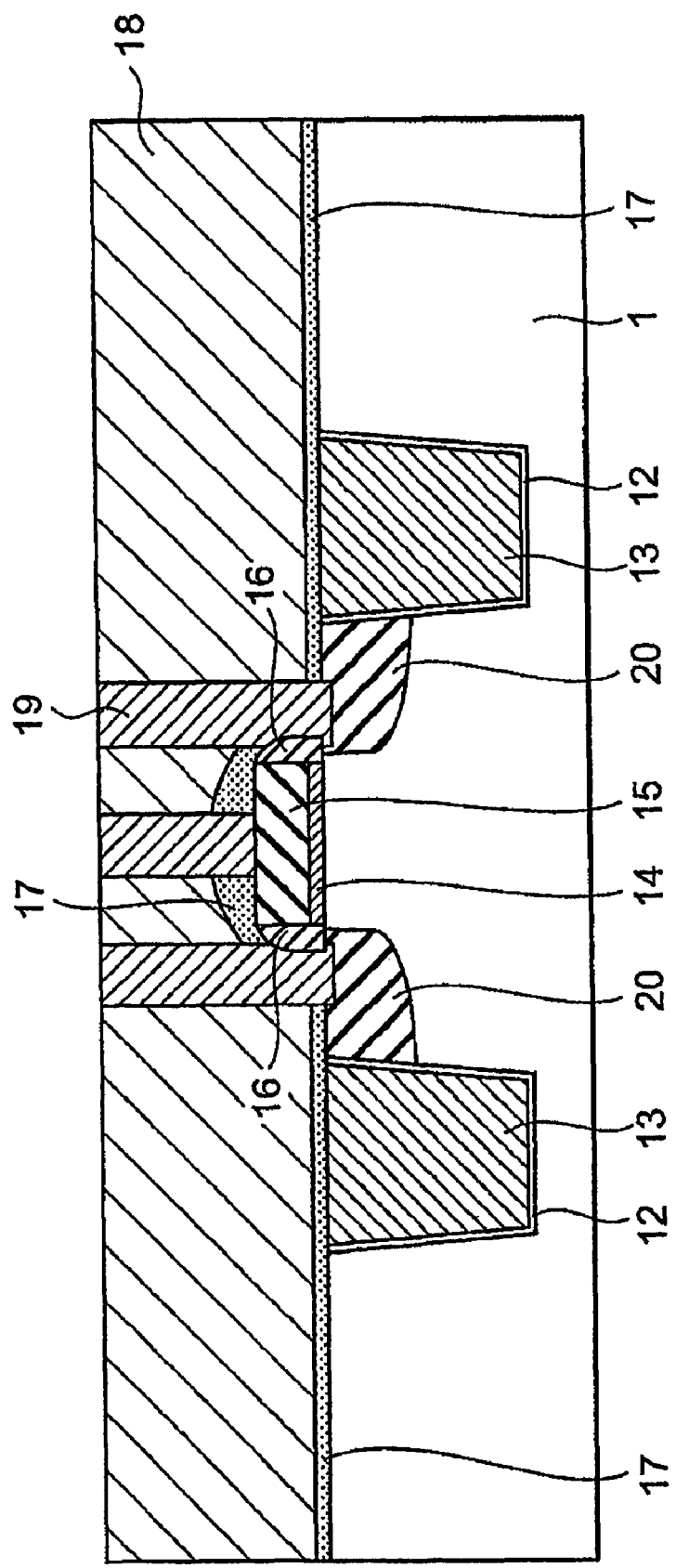
[Fig. 3]

SEMICONDUCTOR DEVICE

This application is a National Stage of PCT/JP2006/300474, filed Jan. 17, 2006, and claims priority to Japanese Application No. 2005-010117, filed Jan. 18, 2005, the disclosures of which are hereby incorporated by reference in their entirety their entirety.

TECHNICAL FIELD

This invention relates to a semiconductor device and, in particular, relates to a semiconductor device aiming at a reduction in dielectric constant using an organic compound as an insulator.

BACKGROUND ART

In a general semiconductor device, an insulator is used for element isolation or as a dielectric.

Herein, referring to FIG. 3, the structure of a general semiconductor device will be described.

Source/drain diffusion layers 20 are formed in an element forming region of a silicon substrate 1. An element isolation region (STI portion) composed of a silicon oxide film ($SiO_2$ film) 12 and an insulating film ($SiO_2$ film) 13 is formed around the element forming region. A gate electrode 15 is formed on the element forming region through a gate insulating film 14 and an interlayer insulating film 18 is formed so as to cover the element forming region and the element isolation region.

Sidewalls ($Si_3N_4$ film) 16 are formed on the side walls of the gate electrode 15 and a $SiO_2$ film 17 is formed so as to cover the gate insulating film 14 and the gate electrode 15. Further, the $SiO_2$ film 17 is also formed between the silicon substrate 1 and the interlayer insulating film 18. Metal layers (plugs) 19 are connected to the source/drain diffusion layers 20 and the gate electrode 15, respectively.

Conventionally, the insulator is basically formed of a silicon oxide (relative dielectric constant: 3.9).

Currently, in uses other than a function of inducing electric charge, a reduction in dielectric constant is required for suppressing signal delay and the dielectric constant is reduced by adding fluorine to a silicon oxide or providing an air gap.

Although use is made of a silicon oxide film ($SiO_2$ film) for directly isolating a transistor or isolation between transistors by the use of an element isolation region such as LOCOS or STI (Shallow Trench Isolation) (see FIG. 3), it will be necessary in future to achieve a reduction in dielectric constant also for this portion.

Currently, a material used for isolation between transistors is formed on the basis of silicon such as a silicon oxide film ($SiO_2$, $\in=3.9$) or a silicon nitride film ($Si_3N_4$, $\in=7.8$). However, there is a problem that the relative dielectric constant of each of them is about 3.0 even by adding F or C and it is difficult to achieve a reduction in dielectric constant if the silicon nitride film is combined.

DISCLOSURE OF THE INVENTION

Problem to be Solved by the Invention

Therefore, this invention has been made in view of the foregoing problem of the conventional technique and has an object to achieve a reduction in dielectric constant of an insulating film layer for isolation between transistors or between wirings without providing an air gap in the insulating film layer.

Means for Solving the Problem

According to this invention, a semiconductor device, comprising: an element forming region formed in a substrate, an element isolation region formed around the element forming region, a gate electrode formed on the element forming region through a gate insulating film, and an interlayer insulating film formed so as to cover the element forming region and the element isolation region, wherein at least part of the element isolation region and the interlayer insulating film, other than the gate insulating film, is formed of carbon fluoride (CFx, $0.3<x<0.6$).

Further, a protection insulating film is formed on the element forming region so as to cover the gate insulating film and the gate electrode, wherein at least part of the protection insulating film is formed of carbon fluoride (CFx, $0.3<x<0.6$). Herein, preferably, a relative dielectric constant of the gate insulating film is 3.9 or more.

For example, the gate insulating film is a silicon oxide film or a silicon oxynitride film. Herein, a relative dielectric constant of the element isolation region, the interlayer insulating film, and the protection insulating film is 3.0 or less.

Further, according to this invention, a semiconductor device, comprising: an element forming region formed in a substrate, an element isolation region formed around the element forming region, a gate electrode formed on the element forming region through a gate insulating film, and an interlayer insulating film formed so as to cover the element forming region and the element isolation region, wherein at least part of the element isolation region and the interlayer insulating film, other than the gate insulating film, is formed of hydrocarbon (CHy, $0.8<y<1.2$).

Further, a protection insulating film is formed on the element forming region so as to cover the gate insulating film and the gate electrode, wherein at least part of the protection insulating film is formed of said hydrocarbon (CHy, $0.8<y<1.2$). Herein, preferably, a relative dielectric constant of the gate insulating film is 3.9 or more.

For example, the gate insulating film is a silicon oxide film or a silicon oxynitride film. Herein, a relative dielectric constant of the element isolation region, the interlayer insulating film, and the protection insulating film is 3.0 or less.

Moreover, according to this invention, a semiconductor device, comprising: an element forming region formed in a substrate, an element isolation region formed around the element forming region, a gate electrode formed on the element forming region through a gate insulating film, and an interlayer insulating film formed so as to cover the element forming region and the element isolation region, wherein at least part of the element isolation region and the interlayer insulating film, other than the gate insulating film, is formed of hydrocarbon ($CH_{y1}$) and hydrocarbon ($CH_{y2}$) partially substituted by a substituent, wherein y1 and y2 satisfy a relationship of $0.8<y1$, $y2<1.2$, and $y1 \neq y2$.

Further, a protection insulating film is formed on the element forming region so as to cover the gate insulating film and the gate electrode, wherein at least part of the protection insulating film is formed of hydrocarbon ($CH_{y1}$) and hydrocarbon ($CH_{y2}$) partially substituted by a substituent, wherein y1 and y2 satisfy the relationship of $0.8<y1$, $y2<1.2$, and $y1 \neq y2$. Herein, preferably, a relative dielectric constant of the gate insulating film is 3.9 or more.

For example, the gate insulating film is a silicon oxide film or a silicon oxynitride film. Herein, a relative dielectric constant of the element isolation region, the interlayer insulating film, and the protection insulating film is 3.0 or less. The substituent contains nitrogen, sulfur, oxygen or halogen.

EFFECT OF THE INVENTION

In this invention, by forming an insulating film of hydrocarbon or carbon fluoride, the relative dielectric constant thereof can be set to 3.0 or less with no air gap.

In this invention, by performing hydrogen or carbon fluoride film formation according to a CVD method, it is possible to achieve a reduction in dielectric constant of an insulating film to thereby suppress signal propagation delay of a semiconductor device.

BRIEF DESCRIPTION OF THE DRAWINGS

FIG. 1 A diagram showing the structure of a semiconductor device (MOSFET) of this invention.

FIGS. 2(A), 2(B) and 2(C) Diagrams showing a manufacturing method of the semiconductor device of this invention.

FIG. 3 A diagram showing the structure of a conventional semiconductor device (MOSFET).

BEST MODE FOR CARRYING OUT THE INVENTION

Next, referring to FIG. 1 and FIG. 2, (A) to (C), an embodiment of this invention will be described.

At first, referring to FIG. 1, the structure of a semiconductor device of this invention will be described.

Source/drain diffusion layers 7 are formed in an element forming region of a silicon substrate 1. An STI portion insulating film 4 as an element isolation region is formed around the element forming region. The STI portion insulating film 4 is a CHy film formed of hydrocarbon (CHy, 0.8<y<1.2).

A gate electrode 6 is formed on the element forming region through a gate insulating film 5 and an interlayer insulating film 10 is formed so as to cover the element forming region and the element isolation region. In this case, the gate insulating film 5 may be formed of $SiO_2$, SiON, or $Si_3N_4$ having a relative dielectric constant of 3.9 or more, or a high-k material such as $HfO_2$. The interlayer insulating film 10 is formed of carbon fluoride (CFx, 0.3<x<0.6).

Sidewalls 8 and a CHy film 9 are formed so as to cover the gate insulating film 5 and the gate electrode 6 (herein, the sidewalls 8 and the CHy film 9 form a protection insulating film). Further, the CHy film 9 is also formed between the silicon substrate 1 and the interlayer insulating film 10. Metal layers (plugs) 11 are connected to the source/drain diffusion layers 7 and the gate electrode 6, respectively.

Next, referring also to FIG. 2, (A) to (C), a manufacturing method of the semiconductor device of this invention will be described.

At first, a thermal oxide film 2 of 30 nm is formed on a silicon substrate 1 and a nitride film 3 of 200 nm is formed by a CVD method. Thereafter, using a photoresist as a mask, the nitride film 3, the oxide film 2, and the silicon substrate 1 are etched by 300 nm. In this manner, a trench for element isolation is formed on the silicon substrate 1 (see FIG. 2, (A)).

Thereafter, the insulating film 4 of 500 nm is formed by a microwave-excited CVD method and etching/flattening is performed to a level of the nitride film 3 by a CMP method. Thereafter, the nitride film 3 and the oxide film 2 are removed (see FIG. 2, (B)).

Thereafter, a gate insulating film 5 of 2 nm and a gate electrode (polysilicon) 6 of 200 nm are formed and the gate electrode (polysilicon) 6 is etched using a photoresist as a mask. Thereafter, using a photoresist as a mask, P is implanted in an nMOS region at $5 \times 10^{14}$ cm$^{-2}$ while B is implanted in a pMOS region at $5 \times 10^{14}$ cm$^{-2}$. Thus, source/drain diffusion layers 7 are formed. Then, a CHy film of 10 nm is formed by a CVD method and sidewalls 8 are formed by anisotropic etching. Thereafter, further, using a photoresist as a mask, As is implanted in the nMOS region at $5 \times 10^{15}$ cm$^{-2}$ while B is implanted in the pMOS region at $5 \times 10^{15}$ cm$^{-2}$ (see FIG. 2, (C)).

Subsequently, a CHy film 9 of 10 nm is formed and CFx 10 of 500 nm is formed thereover as an interlayer insulating film by a CVD method.

Thereafter, a photo process is carried out to open contact holes, then, by performing film formation of TiN or W and implementing CMP, a metal layer (metal layer) 11 is formed in each of the contact holes.

In this manner, a semiconductor device in which part or all, other than the gate insulating film 5, are made of carbon fluoride (CFx) or hydrocarbon (CHy) (see FIG. 1) is formed, where 0.3<x<0.6 and 0.8<y<1.2.

Herein, the relative dielectric constant of the CHy film is 2.5 and the relative dielectric constant of the CFx film is 2.2, wherein CHy is acetylene and CFx is $C_5F_8$.

Herein, the average relative dielectric constant is 2.5 or less, while, the relative dielectric constant of a normal layer formed of $SiO_2$ or $Si_3N_4$ is 4 to 5. Therefore, speed delay due to capacitance between transistors becomes 1/1.8 to 1/2.

As long as the combined relative dielectric constant does not exceed 3.0, a $SiO_2$ film may be formed by thermal oxidation before forming the insulating film 4.

A gas ($C_2H_2Cl_2$, $CH_2Cl_2$, or $CHClF_2$) containing a halogen such as Br or Cl may be used as a reaction gas in the foregoing CVD. In this case, the film contains a halogen such as Br ($CH_3Br$, $C_2H_5Br$, or $CH_2Br_2$) or Cl.

Alternatively, a gas ($CH_3OCH_3$) containing O may be used as a reaction gas in the foregoing CVD. In this case, the film contains O.

Alternatively, a gas (($CH_3$)$_3$N or ($CH_3$)$_2$NH) containing N may be used as a reaction gas in the foregoing CVD. In this case, the film contains N.

A gas containing sulfur may be used as a reaction gas in the foregoing CVD. In this case, the film contains sulfur.

Further, the interlayer insulating film 10 may be a CHy' film having a composition different from that of the CHy films 8 and 9.

As described above, in a semiconductor device of this invention, at least part of an element isolation region, an interlayer insulating film, and a protection insulating film, other than a gate insulating film (silicon oxide film), is formed of carbon fluoride (CFx, 0.3<x<0.6) or hydrocarbon (CHy, 0.8<y<1.2).

Alternatively, in a semiconductor device of this invention, at least part of an element isolation region, an interlayer insulating film, and a protection insulating film, other than a gate insulating film (silicon oxide film), is formed of hydrocarbon ($CH_{y1}$) and hydrocarbon ($CH_{y2}$) partially substituted by a substituent. Herein, y1 and y2 satisfy a relationship of 0.8<y1, y2<1.2, and y1≠y2. Further, the substituent contains nitrogen, sulfur, oxygen or a halogen.

By adopting such a configuration, the relative dielectric constant of the foregoing element isolation region, interlayer insulating film, and protection insulating film can be set to 3.0 or less.

INDUSTRIAL APPLICABILITY

This invention is applicable to a semiconductor device aiming at a reduction in dielectric constant using an organic compound as an insulator.

The invention claimed is:

1. A semiconductor device, comprising:
   an element forming region formed in a substrate,
   an element isolation region formed around the element forming region,
   a gate electrode formed on the element forming region through a gate insulating film,
   an interlayer insulating film formed so as to cover the element forming region and the element isolation region, and
   a protection insulating film formed on the element forming region so as to cover the gate insulating film and the gate electrode,
   wherein the protection insulating film comprises a first insulating film located at an upper portion of the gate electrode and a second insulating film located at side portions of the gate electrode, the second insulating film serving as sidewalls,
   wherein the element isolation region is formed of a hydrocarbon (CHy, $0.8<y<1.2$),
   the interlayer insulating film is formed of a carbon fluoride (CFx, $0.3<x<0.6$), and
   the first insulating film of the protection insulating film is formed of a hydrocarbon (CHy).

2. The semiconductor device according to claim 1, wherein:
   a relative dielectric constant of the gate insulating film is 3.9 or more.

3. The semiconductor device according to claim 1, wherein:
   the gate insulating film is a silicon oxide film or a silicon oxynitride film.

4. The semiconductor device according to claim 1, wherein:
   a relative dielectric constant of the element isolation region, the interlayer insulating film, and the protection insulating film is 3.0 or less.

5. The semiconductor device according to claim 1, wherein:
   a film formed of a hydrocarbon (CHy) is located between the substrate and the interlayer insulating film except for the element forming region.

* * * * *

UNITED STATES PATENT AND TRADEMARK OFFICE
CERTIFICATE OF CORRECTION

PATENT NO. : 7,893,537 B2  
APPLICATION NO. : 11/795308  
DATED : February 22, 2011  
INVENTOR(S) : Tadahiro Ohmi and Akinobu Teramoto Page 1 of 1

It is certified that error appears in the above-identified patent and that said Letters Patent is hereby corrected as shown below:

On the Title Page, please correct the following:

Item (73) Assignee: Please change "Tohoku Uinversity" to --Tohoku University--.

Item (86) PCT No.: Please change "PCT/JP2006/000474" to --PCT/JP2006/300474--.

Signed and Sealed this  
Twelfth Day of July, 2011

David J. Kappos  
*Director of the United States Patent and Trademark Office*